United States Patent [19]
Janssen

[11] Patent Number: 4,795,984

[45] Date of Patent: Jan. 3, 1989

[54] MULTI-MARKER, MULTI-DESTINATION TIMING SIGNAL GENERATOR

[75] Inventor: James R. Janssen, San Jose, Calif.

[73] Assignee: Schlumberger Systems & Services, Inc., Palo Alto, Calif.

[21] Appl. No.: 932,762

[22] Filed: Nov. 19, 1986

[51] Int. Cl.[4] .................... H03K 17/296; H03M 7/00
[52] U.S. Cl. ........................................ 328/75; 328/70; 328/71; 377/26; 377/39
[58] Field of Search .................... 377/26, 39, 107, 110; 328/71, 75, 70

[56] References Cited

U.S. PATENT DOCUMENTS

| | | | |
|---|---|---|---|
| 3,391,305 | 7/1968 | Bradwin et al. | 377/110 |
| 3,824,378 | 7/1974 | Johnson et al. | 377/39 |
| 3,878,370 | 4/1975 | Satomango et al. | 377/39 |
| 4,001,699 | 1/1977 | Denny et al. | 377/39 |
| 4,566,111 | 1/1986 | Tanagwa | 377/39 |

*Primary Examiner*—John S. Heyman
*Attorney, Agent, or Firm*—David H. Carroll; Robert C. Colwell; James A. Deland

[57] ABSTRACT

A multi-marker, multi-destination timing signal generator including a count-setting memory for storing a plurality of pulse-count values in a numerical order and a pulse counter for counting the number of pulses from a master clock. An output selection memory stores, for each pulse count value, enabling signals for a plurality of output elements so that a marker signal generated when the pulse counter equals a pulse-counter value in memory may be selectively routed to one or more output elements. The addresses of the count-setting memory and the output selection memory are maintained by an address counter. When the value of the pulse counter equals a pulse-count value stored in the count-setting memory, the address counter counts to the next address value for locating successive values in the count-settiong memory and the output selection memory.

19 Claims, 3 Drawing Sheets

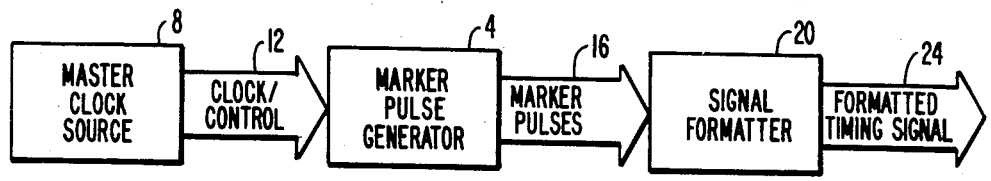
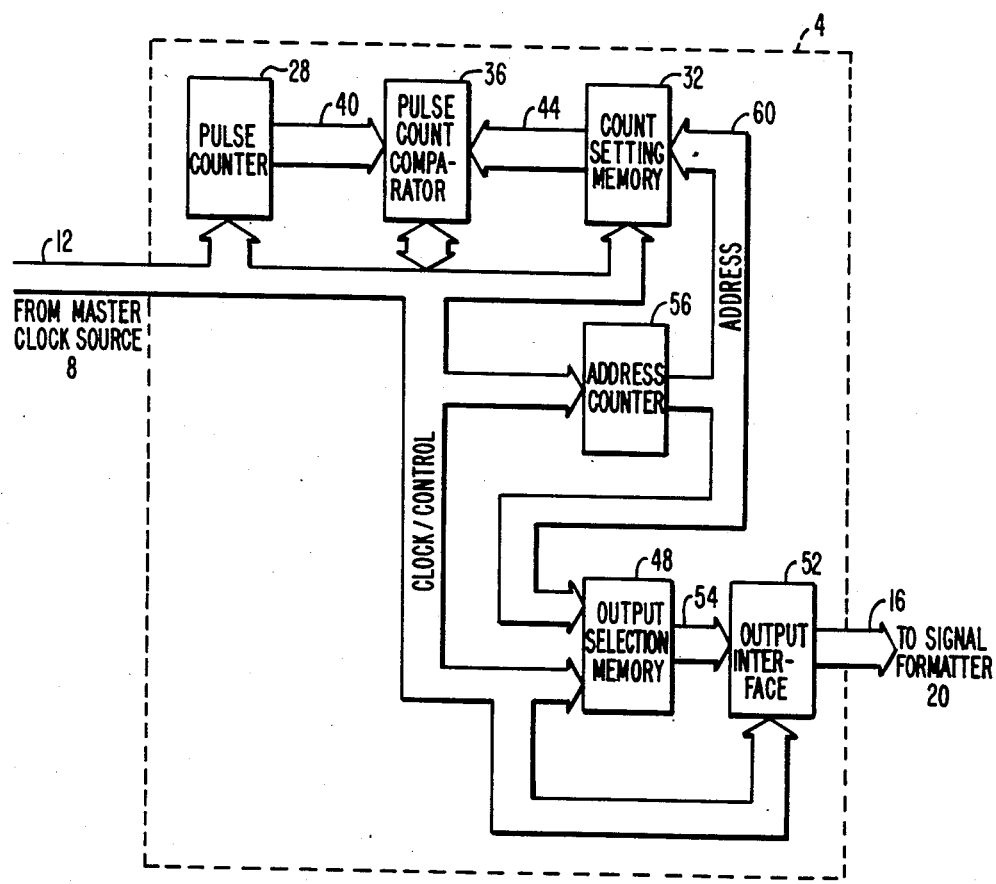

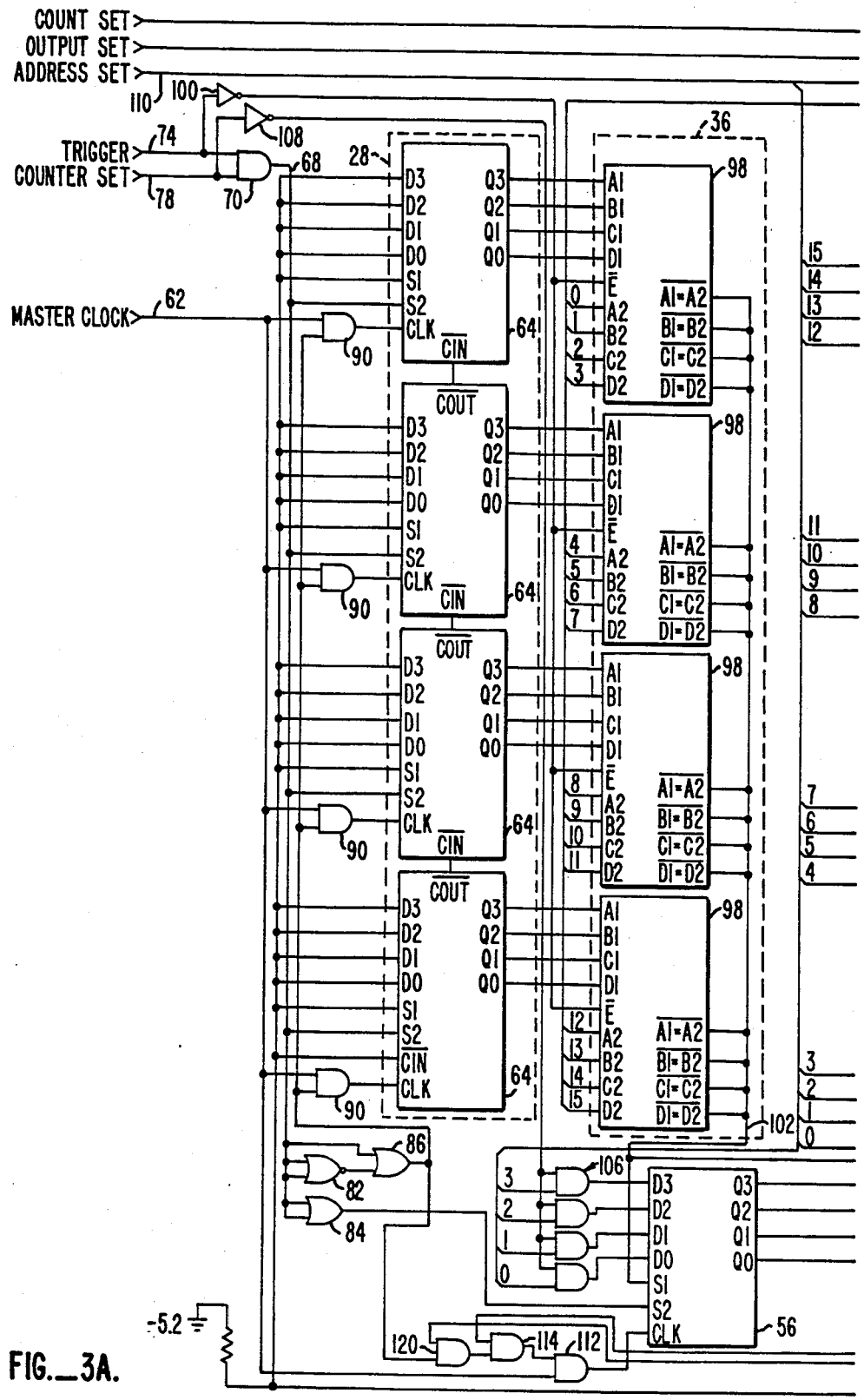
FIG._3A.

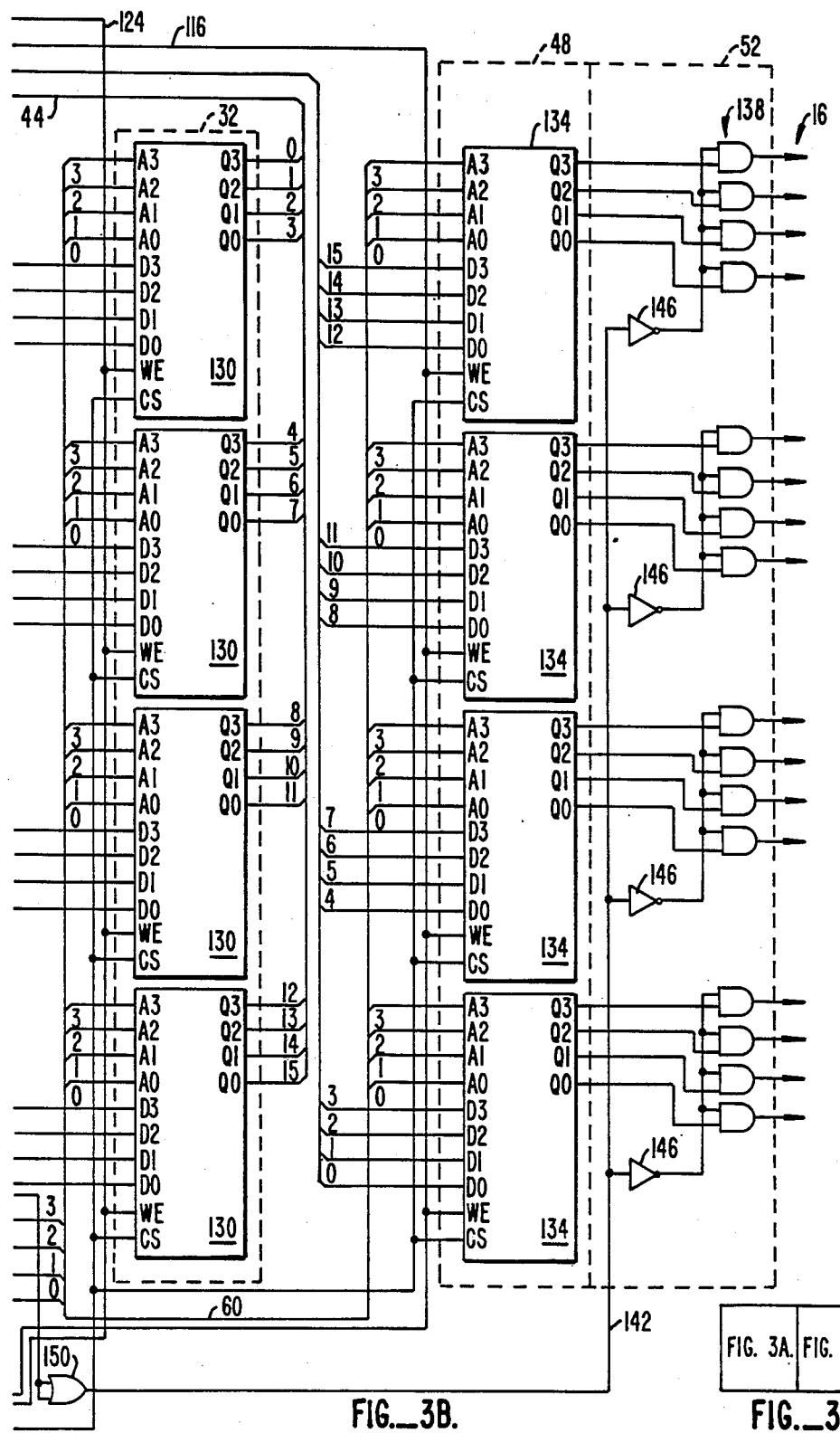
FIG._3B.
FIG._3.

MULTI-MARKER, MULTI-DESTINATION TIMING SIGNAL GENERATOR

BACKGROUND OF THE INVENTION

1. Field Of The Invention

The present invention relates to timing devices and, more particularly, to an apparatus for generating a plurality of time markers and for selectively routing the time markers to a plurality of output elements.

2. Description Of The Prior Art

Electronic devices, such as integrated circuits, often operate with timing signals having a particular format, such as return-to-zero non-return-to-zero, surround-by-complement, and inverted and/or delayed versions of these formats. When such devices are to be tested by an automatic test system the particular timing signal required by the device under test must be provided by the test system. In some applications, a single, dedicated circuit is constructed for generating the signal format required. However, sometimes it is necessary for the test system to communicate with many different devices, with each different device requiring a distinct timing format. When the number of such devices is large, it is often infeasible to construct a separate clocking source for each device. Furthermore, the timing characteristics of the device under test may change from time to time as improved versions of the device are constructed. Additionally, the timing characteristics of many devices are not known until the device is connected to the test system.

Prior art attempts to provide flexibility in such systems include forming the desired timing signals using programmable circuitry. In this approach, master clock pulses are counted after a trigger pulse, and the system generates a marker pulse for a timing signal formatting circuit after a prescribed number of pulses has been counted. In one such system, termed the counter-per-marker architecture, a counter is preloaded by the trigger pulse with the number of master clock cycles of delay that are desired. The circuit then generates a marker pulse when the counter has counted down to zero. This method has the drawback of requiring one counter circuit for each marker pulse that is desired.

A related prior art method, termed the comparator-per-marker architecture, involves the use of only one counter, which is reset to zero by each trigger pulse. A register and a digital comparator are then connected to the counter output for each marker pulse desired. Each register contains a prescribed pulse count value, and marker pulses are generated as the clock pulse counter counts through the register values. Many comparator/register circuits can be run from one counter circuit, but this method still requires duplication of comparator/register circuitry for each marker to be generated.

Finally, a particular marker pulse may have to be used for formatting more than one timing signal. In known systems, not necessarily in the prior art, such multiple formats must be known in advance, and the circuit must be hard-wired to accommodate them. This reduces the flexibility of the timing signal generator.

SUMMARY OF THE INVENTION

The present invention contemplates the use of a digital electronic circuit for generating independently settable timing marker pulses, steerable to one or more possible destinations. In one embodiment of the present invention, a count-setting memory stores a plurality of pulse-count values in a numerical order and a pulse counter counts the number of pulses from a master clock. An output selection memory stores, for each pulse count value, enabling signals for a plurality of output elements so that a marker signal generated when the pulse counter equals a pulse-count value in memory may be selectively routed to one or more output elements. The addresses of the count-setting memory and the output selection memory are maintained by an address counter. When the value of the pulse counter equals a pulse-count value stored in the count-setting memory, the address counter counts to the next address value for locating succeeding values in the count-setting memory and the output selection memory. This sequence continues until all corresponding values in the count-setting memory and output selection memory have been processed, whereupon a trigger pulse resets the pulse counter and the address counter, and the cycle begins again.

BRIEF DESCRIPTION OF THE DRAWINGS

FIG. 1 is a conceptual block diagram of a timing signal generator according to the present invention;

FIG. 2 is a block diagram of the marker pulse generator of FIG. 1.

FIG. 3 is a detailed circuit diagram of the marker pulse generator of FIG. 2.

DESCRIPTION OF A PREFERRED EMBODIMENT

FIG. 1 is a conceptual block diagram of a system for generating timing signals according to the present invention. As shown in FIG. 1, a marker pulse generator 4 receives master clock and control signals from a master clock source 8 through a clock/control bus 12. Marker pulse generator 4 supplies marker pulses on a marker pulse bus 16 to a signal formatter 20, wherein the marker pulses are processed to produce formatted timing signals 24.

FIG. 2 is a block diagram of the marker pulse generator 4 shown in FIG. 1. As shown in FIG. 2, marker pulse generator 4 includes a pulse counter 28 for counting master clock pulses from master clock source 8, a count-setting memory 32 for storing a plurality of pulse-count values, and a pulse-count comparator 36 for comparing the then present value of pulse counter 28 with a preset pulse-count value from count-setting memory 32 and for indicating when the values match. Pulse count comparator 36 communicates with pulse counter 28 and count-setting memory 32 through a counter-comparator bus 40 and a comparator-memory bus 44, respectively.

An output selection memory 48 provides, for each pulse count value within count-setting memory 32, enabling signals for an output interface 52 through a memory-interface bus 54. To match a pulse-count value in count-setting memory 32 with its associated enabling signals in output selection memory 48, both memories share a common addressing scheme, and the address information is provided by an address counter 56 through an address bus 60. Pulse counter 28, pulse count-comparator 36, count-setting memory 32, output selection memory 48, output interface 52, and address counter 56 receive clock and/or control information through clock/control bus 12.

FIG. 3 is a detailed circuit diagram of marker pulse generator 4. Pulse counter 28 illustrated therein counts clock pulses received on a line 62 from master clock source 8 and comprises four cascaded 4-bit binary counters 64, together preferably part number 10H136 available from Fairchild Semiconductor of Cupertino, Calif. The D0–D3 input terminals of each 4-bit counter 64 are connected to the −5.2 volt potential for presetting each counter to zero. The S1 and S2 input terminals set the mode of operation of each 4-bit counter 64 in response to low and high input signals as shown in Table 1.

TABLE 1

| S1 | S2 | |
|---|---|---|
| L | L | Preset |
| L | H | Count Up |
| H | L | Count Down |
| H | H | Stop |

In this embodiment, pulse counter 28 operates only in either preset or count-up mode, so the S1 terminal of each counter 64 is connected to a −5.2 volt potential through a resistor R1 and receives a constantly low input therefrom. The S2 input terminal of each 4-bit counter 64 is connected to a mode line 68 for selectively controlling the operation of pulse counter 28. Mode line 68 is connected to the output from an AND gate 70 which, in turn, receives from master clock source 8 a trigger input on line 74 and a counter-set input on line 78. Mode line 68 is also connected to a NOR gate 82, an OR gate 84, and an OR gate 86. The purpose of these gates is discussed later.

The CLK input terminal of each 4-bit counter 64 is connected to the output terminal of an AND gate 90. Each AND gate 90 receives a master clock signal from master clock source 8 on line 94 and is enabled by an enabling signal from OR gate 86. To form a 16-bit counter, each $\overline{CIN}$ input terminal of a counter 64 is connected to the $\overline{COUT}$ output terminal of an adjacent counter. The $\overline{COUT}$ output of a 4-bit counter is active on the terminal count for that counter and provides a carry-out for the adjacent counter. The lines connected to output terminals Q0–Q3 of each 4-bit counter 64 form the counter-comparator bus 40 (FIG. 2) and supplies the pulse count values to pulse-count comparator 36.

Pulse-count comparator 36 compares the value from pulse counter 28 with a pulse count value from count-setting memory 32 and comprises four comparators 98, preferably four quad exclusive OR gates, together available as Fairchild Part No. 10H113. The D1, C1, B1, and A1 input terminals of each comparator 98 are connected to the respective Q0, Q1, Q2, and Q3 output terminals of an associated 4-bit counter 64 for receiving the value from pulse counter 28, and the A2, B2, C2, and D2 input terminals are connected to successive lines of comparator-memory bus 44 for receiving a pulse count value from count setting memory 32. The enable terminal of each comparator 98 enables chip operation and is connected to receive the trigger input signal on line 74 through an inverter 100. The output terminals of each comparator 98 are wire-ORed to form a match line 102 for indicating when the values from pulse counter 28 and count setting memory 32 match.

Address counter 56 provides the proper addresses to count-setting memory 32 and output selection memory 48, and it increments each address when a count value in count-setting memory 32 corresponds to a value from pulse counter 28. Address counter 56 comprises a 4-bit binary counter, preferably Fairchild Part No. 10H136. The D0–D3 input terminals are connected to respective output terminals of AND gates 106. Each AND gate 106 is enabled by the counter-set input signal on line 78 through an inverter 108 and receives address set input signals from master clock source 8 on lines 110 for initializing address counter 56 prior to operation.

The S1 and S2 input terminals of address counter 56 control the mode of operation of the counter and function the same as in pulse counter 28 (see Table 1) The S1 terminal is connected to match line 102, and the S2 terminal is connected to the output terminal of OR gate 84. The CLK input terminal is connected to an AND gate 112 which, in turn, has one of its input terminals connected to line 62 for receiving master clock signals from master clock source 8. AND gate 112 is enabled by signals from an AND gate 114 which, in turn, receives an output set input signal from master clock source 8 on line 116 and the output from an AND gate 120, respectively. AND gate 120 has its input terminals connected to OR gate 86 and to a count-set input signal from master clock source 8 on line 124. The output from OR gate 86, output set input 116, and count-set input 124 thus enable counting of address counter 56, and each signal must be high in order for counting to occur. The Q0–Q3 outputs of address counter 56 are connected to respective lines of address bus 60 for communicating the address information to count-setting memory 32 and output selection memory 48, respectively.

Count-setting memory 32 stores a plurality of pulse count values and comprises four count memories 130. Count memories 130 preferably are 64-bit RAMs organized as 16×4 arrays, together available as Fairchild Part No. 10H145. The A0–A3 input terminals of each count memory 130 are connected to the Q0–Q3 output terminals of address counter 56 through address bus 60 for receiving address information therefrom. The D0–D3 input terminals of each count memory 130 receive address set input signals from master clock source 8 on lines 110 for initializing count setting memory 32 prior to operation. The write-enable (WE) input terminal of each count memory 130 receives count set input signals from master clock source 8 over line 124 for allowing the initial count values to be input to count setting memory 32, and each chip-select (CS) input terminal is connected to a −5.2 volt potential through resistor R1 for allowing normal operation of each memory. The Q0–Q3 output terminals of each count memory 130 are connected to respective D2, C2, B2, and A2 input terminals of an associated comparator 98 through comparator-memory bus 44 for comparing a present count value in count setting memory 32 with the value from pulse counter 28.

Output selection memory 48 selects which lines on marker pulse bus 16 receive the marker pulse generated when a pulse count value from count setting memory 32 matches a value from pulse counter 28. Output selection memory 48 comprises four output memories 134, preferably Fairchild Part No. 10H145. The address input terminals A0–A3 of each output memory 134 are connected to output terminals Q0–Q3 of address counter 56 through address bus 60 for receiving address information therefrom. The data input terminals D0–D3 of each output memory 134 receive address set input signals from master clock source 8 on lines 110 for initializing output selection memory 48 prior to operation. The write-enable (WE) input terminal of each output memory 134 receives output set input signals from master clock source 8 over line 116 for allowing the initial output selection values to be input to output selection memory 48, and each chip-select (CS) input terminal is connected to a −5.2 volt potential through a resistor R1 for allowing normal operation of each memory. The lines connected to output terminals Q0–Q3 of each output memory 134 supply enabling signals to output interface 52 and comprise memory-interface bus 54 (FIG. 2).

Output interface 52 generates timing marker pulses in accordance with the output signals from output selection memory 48 and routes the marker pulses to selected lines of marker pulse bus 16. Output interface 52 comprises a plurality of AND gates 138, each receiving enabling signals from a respective Q0, Q1, Q2, or Q3 output terminal of an output memory 134. Each AND gate 138 is further connected to an output enable line 142 through inverters 146. Output enable line 142 is, in turn, connected to an OR gate 150 for receiving signals from match line 102.

Operation

Marker pulse generator 4 is initialized by asserting counter set input line 78 low, which results in a low signal on the S1 and S2 terminals of each 4-bit counter 64. Since OR gate 86 is connected to the output from NOR gate 82, and both NOR gate 82 and the other input terminal of OR gate 86 are connected to mode line 68, the output of OR gate 86 will ordinarily be high for enabling AND gate 90, and the next clock pulse received on line 62 presets the counters to zero as a result of the low signal on each D0–D3 terminal. If the signal on line 62 is high at the time counter set input line 78 is asserted low, a clocking pulse will nevertheless be simulated as a result of the propagation delay through NOR gate 82 which causes the output from OR gate 86 to undergo a brief transition from high to low and then back to high again. This in turn causes a high-low-high signal at the output of each AND gate 90 for clocking each counter 64 and setting them to zero. (The same thing occurs if line 74 is asserted low and line 62 is already high.) Asserting counter set input line 78 low also results in a high input signal to AND gates 106 from inverter 108. This high signal enables AND gates 106, and address values may then be supplied to address counter 56 through address set input lines 110.

Count set input line 124 is then asserted low, and the first count value is supplied to count memories 130 through address set input lines 110. Successive address values are then input to address counter 56, and the pulse count values associated therewith are supplied to count memories 130 via address set lines 110. Similarly, output selection memory 48 is initialized by asserting output set line 116 low and supplying the initial and subsequent output select values to each output memory 134 through lines 110. After the last values are stored in count-setting memory 32 and output selection memory 48, address counter 56 is reset to the initial address value, and counter set input line 78 is asserted high for enabling AND gate 70 to respond to signals from trigger input line 74.

Output set input line 116 and count set input line 124 are then asserted high for allowing normal operation of count setting memory 32 and output selection memory 48. The initial address value is output from address counter 56 on its Q0–Q3 output terminals and addresses the first entry in count setting memory 32 and output selection memory 48, respectively. As a result, the initial pulse count value appears at the successive Q0–Q3 output terminals of count memories 130, and the output enable signals for that count setting are output on the Q0–Q3 output terminals of output memories 134.

The high signal on output set input line 116 enables AND gate 114 to respond to the output signal from AND gate 120, and the high signal on count set input line 124 enables AND gate 120 to respond to the output from OR gate 86. Since the output of OR gate 86 will ordinarily be high, AND gate 120 produces a high signal which, in turn, causes AND gate 114 to produce a high signal for enabling AND gate 112 to respond to master clock input 94 for clocking address counter 56.

The high signal from OR gate 86 additionally enables AND gates 90 so that 4-bit counters 64 may be clocked by the signals on master clock input line 62. As noted above, 4-bit counters 64 count up in response to the clocking signals on master clock input line 62 whenever the signal supplied to terminal S1 is low and the signal supplied to terminal S2 is high. (See Table 1.) Since the signal supplied to terminal S1 is always low, 4-bit counters 64 count up when the output from AND gates 70 is high, i.e., when trigger input line 74 and counter set input line 78 are both high. Since the signal on counter set input line 78 remains high after initialization, pulse counter 28 is enabled for counting and thus controlled by the signal on trigger input line 74 during normal operation.

After trigger input line 74 is asserted high, pulse counter 28 counts pulses from master clock input line 94 until the pulse count value appearing on the successive output terminals Q0–Q3 of each 4-bit counter 64 equals the pulse count value appearing on the successive Q0–Q3 output terminals of count memories 130. When this occurs, each output terminal of comparators 98 is asserted low, and this low signal is communicated to inverters 146 through OR gate 150. Inverters 146, in turn, produce a high signal for enabling AND gates 138 to respond, for one clock pulse, to the output enable signals appearing on output terminals Q0–Q3 of each output memory 134. Each AND gate 138 which receives a high enabling signal from output selection memory 48 thus communicates a marker pulse to its associated line on marker pulse bus 16. Similarly, each AND gate 138 which receives a low, or non-enabling, signal from output selection memory 48, inhibits communication of a marker pulse to its associated line on marker pulse bus 16.

The S2 input terminal of address counter 56 is connected to the output terminal of OR gate 84 for receiving the high signal from mode line 68 when pulse counter 28 is counting the master clock pulses, and the S1 input terminal is connected to match line 102. Since the signal on match line 102 is high until every output from comparators 98 are asserted low, the combination of high signals on both S1 and S2 inhibit address counter 56 from counting until a match occurs (see Table 1). When a match does occur, the low signal on match line 102 is communicated to S1 for enabling address counter 56 to count up. Upon the next clock pulse, address counter 56 increments and communicates the new address value to count-setting memory 32 and output selection memory 48. If the new value appearing at the output terminals of count-setting memory 32 does not equal the new count value from pulse counter 28, then a high signal appears on match line 102 which inhibits further incrementing of address counter 56 until the next match occurs. If the pulse count value is again matched, then the resulting low signal on match line 102 causes another marker pulse to be communicated to marker pulse bus 16, and address counter 56 increments to the next address value.

The cycle consisting of counting, comparing and pulse generation continues until trigger input line 74 is asserted low, whereupon pulse counter 28 and address counter 56 are reset, and the sequence starts over again.

While the above is a complete description of a preferred embodiment of the present invention, various modifications will be apparent to those of ordinary skill in the art. For example, the size of pulse counter 28, count setting memory 32, and output selection memory 48 may be increased or decreased, as desired, and the enabling protocol may take whatever form is required by the devices used. The pulse count values may be stored in either ascending or descending order and pulse counter 28 set to count up or down as required. Furthermore, the frequency of pulses on master clock input 94 may vary according to the resolution desired. Consequently, the description should not be used to limit the scope of the invention, which is set out in the claims.

What is claimed is:

1. An apparatus for generating a sequence of timing signals comprising:
   counting means, connected to a source of clock pulses, for counting the pulses and for providing a pulse count value which is a sum of clock pulses counted;
   storing means for storing a plurality of pulse count values each pulse count value corresponding to a sum of clock pulses to be counted by the counting means;
   selecting means, connected to the storing means, for selecting a pulse count value in the storing means;
   determining means, connected to the counting means, to the storing means, and to the selecting means, for supplying a match signal when the counting means has counted a number of pulses which is the same as the selected pulse count value;
   generating means, connected to the determining means, for generating a first timing signal in response to the match signal; and
   wherein the selecting means selects a different pulse count value in the storing means in response to the match signal.

2. The apparatus according to claim 1 further comprising:
   routing means, connected to the generating means, for communicating the first timing signal to selective ones of a plurality of output elements.

3. The apparatus according to claim 1 wherein the counting means comprises a first binary counter.

4. The apparatus according to claim 3 wherein the storing means comprises a first addressable binary memory for storing the pulse count values at addresses therein.

5. The apparatus according to claim 4 wherein the selecting means comprises a first memory addressing means for addressing a pulse count value stored in the first memory to be communicated to the determining means.

6. The apparatus according to claim 5 wherein the first memory addressing means comprises a second binary counter connected to the source of clock pulses for counting the pulses in response to the match signal, the value of the second counter being used as the address of a pulse count value stored in the first memory.

7. The apparatus according to claim 6 further comprising routing means for communicating the first timing signal to selective ones of a plurality of output elements.

8. The apparatus according to claim 7 wherein the routing means comprises:
   a plurality of enabling elements, each connected to the generating means and to an associated output element;
   a second addressable binary memory, connected to the enabling elements, for storing a plurality of enabling signals at addresses therein and for communicating an enabling signal to an associated enabling element so that the enabling element communicates the first timing signal from the generating means to an output element; and
   second memory addressing means, connected to the second memory, for addressing the enabling signals stored in the second memory to be communicated to the enabling elements.

9. The apparatus according to claim 8 wherein the second memory addressing means comprises the second counter.

10. The apparatus according to claim 9 wherein the determining means comprises exclusive-OR means for performing an exclusive OR combination of corresponding bits of the values stored in the first counter and the first memory and for generating the match signal when every bit in the first counter value matches the corresponding bit in the first memory value.

11. An apparatus for communicating a signal to a plurality of output elements comprising:
   a plurality of enabling elements, each connected to an associated output element and to a common signal source for receiving the signal therefrom;
   an addressable binary memory, connected to the enabling elements, for storing a plurality of enabling signals at addresses therein and for communicating an enabling signal to a selected enabling element, wherein the enabling element includes means for communicating the common signal from the signal source to an output element in response to the enabling signal and for so long as the enabling signal is being received by the enabling element; and
   addressing means, connected to the memory, for addressing the enabling signals stored in the memory to be communicated to the enabling elements.

12. The apparatus according to claim 11 wherein in the addressing means comprises a binary counter connected to a source of clock pulses for counting the pulses in response to the signal, the value of the counter being used as the address of the enabling signals stored in the memory to be communicated to the enabling elements.

13. An apparatus for communicating a signal to a plurality of output elements comprising:
   counting means, connected to a source of clock pulses, for counting the pulses;
   storing means for storing a pulse count value;
   determining means, connected to the counting means and to the storing means, for supplying a match signal when the counting means has counted a number of pulses which is the same as the pulse count value;
   generating means, connected to the determining means, for generating the signal in response to the match signal;

a plurality of enabling elements, each connected to the generating means and to an associated output element;

an addressable binary memory, connected to the enabling elements, for storing a plurality of enabling signals at addresses therein and for communicating an enabling signal to an associated enabling element so that the enabling element communicates the timing signal from the generating means to an output element; and addressing means, connected to the memory, for addressing the enabling signals stored in the memory to be communicated to the enabling elements.

14. The apparatus according to claim 13 wherein the addressing means comprises a binary counter connected to the source of clock pulses for counting the pulses in response to the match signal, the value of the counter being used as the address of the plurality of enabling signals to be communicated to the output elements.

15. A method for generating a sequence of timing signals comprising the steps of:
  A. storing a plurality of unique pulse count values in addresses of a memory;
  B. counting pulses from a source of clock pulses to provide a sum of pulses counted;
  C. comparing a pulse count value stored at a memory address to the sum of counted clock pulses;
  D. indicating when the pulse count value stored at the memory address equals the sum of counted clock pulses;
  E. setting the memory to an address having a higher pulse count value in response to the indication that the pulse count value stored at the memory address is equal to the sum of counted clock pulses; and
  F. repeating steps C-E for each pulse count value in the memory.

16. A method for communicating a common signal to a plurality of output elements comprising the steps of:
  A. storing a plurality of enabling signals in addresses of a memory;
  B. communicating a plurality of enabling signals stored at a memory address to selected ones of a plurality of enabling elements, each enabling signal being communicated to an associated enabling element;
  C. communicating, by the enabling elements, in response to the plurality of enabling signals and for so long as the enabling signal is being received by the enabling element, the common signal to the plurality of output elements;
  D. setting the memory to a different address; and
  E. repeating steps B-D for each memory address having enabling signals associated therewith.

17. An apparatus for generating a sequence of timing signals comprising:
  counting means, connected to a source of clock pulses, for counting the pulses and for providing a pulse count value which is a sum of clock pulses counted;
  storing means for storing a plurality of pulse count values, each pulse count value representing a different sum of clock pulses counted by the counting means;
  selecting means, connected to the storing means, for selecting a pulse count value in the storing means;
  comparing means, connected to the counting means, to the storing means, and to the selecting means, for simultaneously comparing all digits in the pulse count value provided by the counting means with all digits in the selected pulse count value and for supplying a match signal when the counting means has counted a number of pulses which is the same as the selected pulse count value;
  generating means, connected to the determining means, for generating a timing signal in response to the match signal; and
  wherein the selecting means selects a different pulse count value in response to each match signal for sequentially selecting each of the plurality of pulse count values in the storing means.

18. A method for communicating a common signal to a plurality of output elemens comprising the steps of:
  A. storing a plurality of enabling signals and non-enabling signals in successive addresses of a memory;
  B. communicating a plurality of enabling and non-enabling signals stored at an address of the memory to an associated plurality of enabling elements, each enabling element receiving one of the plurality of enabling and non-enabling signals, those enabling elements which receive an enabling signal being termed a selected enabling element;
  C. communicating the common signal to the plurality of enabling elements;
  D. coupling the plurality of output elements to the plurality of enabling elements for receiving signals therefrom, each output element being coupled to an associated enabling element, each output element coupled to a selected enabling element being termed a selected output element;
  E. communicating, only by the selected enabling elements, in response to the plurality of enabling signals, and for so long as the enabling signal is being received by the selected enabling elements, the common signal to the selected output elements;
  F. setting the memory to a different address; and
  G. repeating steps B-F for each of the successive memory addresses.

19. A method for generating a sequence of timing signals comprising the steps of:
  A. storing a pulse count value in an address of a first memory;
  B. storing a plurality of enabling signals in successive addresses of a second memory;
  C. communicating the plurality of enabling signals stored at a memory address to selected ones of a plurality of enabling elements, each enabling signal being communicated to an associated enabling element;
  D. counting pulses from a source of clock pulses to provide a sum of pulses counted;
  E. comparing the pulse count value to the sum of counted clock pulses;
  F. generating a timing signal when the pulse count value equals the sum of counted clock pulses;
  G. communicating the timing signal to the plurality of enabling elements; and
  H. communicating, by the enabling elements, in response to the plurality of enabling signals, and for so long as the enabling signal is being received by the enabling elements, the timing signal to the plurality of output elements.

* * * * *